US006885227B2

(12) United States Patent
Agrawal et al.

(10) Patent No.: US 6,885,227 B2
(45) Date of Patent: *Apr. 26, 2005

(54) CLOCK GENERATOR WITH SKEW CONTROL

(75) Inventors: Om P. Agrawal, Los Altos, CA (US);
Hans W. Klein, Danville, CA (US);
Geoffrey R. Rickard, Glos (GB);
Harald J. Weller, Bristol (GB)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/629,221

(22) Filed: Jul. 29, 2003

(65) Prior Publication Data

US 2005/0024105 A1 Feb. 3, 2005

(51) Int. Cl.[7] .................................................. H03L 7/06
(52) U.S. Cl. ...................... 327/156; 327/291; 327/296
(58) Field of Search ................................ 327/147–160, 327/291, 295, 296

(56) References Cited

U.S. PATENT DOCUMENTS

| | | | | |
|---|---|---|---|---|
| 6,028,488 | A | * | 2/2000 | Landman et al. ........... 331/1 A |
| 6,279,077 | B1 | * | 8/2001 | Nasserbakht et al. ....... 711/118 |
| 6,622,208 | B1 | * | 9/2003 | North ......................... 711/118 |
| 6,661,254 | B1 | * | 12/2003 | Agrawal et al. .............. 326/41 |
| 6,687,320 | B1 | * | 2/2004 | Chiu et al. .................. 375/376 |

OTHER PUBLICATIONS

U.S. Appl. No. 10/629,223 entitled "Clock Generator" filed on Jul. 29, 2003.
3.3V Programmable Skew PLL Clock Driver Turboclock, IDT5V991A, Commercial and Industrial Temperature Ranges, Sep. 2001.
One–PLL General Purpose Flash–Programmable Clock Generator, CY22050, Cypress Semiconductor Corporation, San Jose, CA, Revised Dec. 14, 2002.
ICS541, PLL Clock Divider, Revision 021303, Integrated Circuit Systems, Inc.
User Programmable Laser Engine Pixel Clock Generator, ICS1574B, Aug. 31, 2000.
EEPROM Programmable 3–PLL Clock Generator IC, FS6370–01, AMI Semiconductor.

* cited by examiner

Primary Examiner—Timothy P. Callahan
Assistant Examiner—Cassandra Cox
(74) Attorney, Agent, or Firm—MacPherson Kwok Chen & Heid LLP; Greg J. Michelson

(57) ABSTRACT

Systems and methods are disclosed to provide clock generation. In accordance with one embodiment, a clock generator chip is provided that is configurable and in-system programmable and includes a flexible skew control architecture. The clock generator chip may also provide programmable input circuits, programmable output circuits, and permit a JTAG boundary scan.

30 Claims, 13 Drawing Sheets

CLOCK GENERATOR WITH SKEW CONTROL

TECHNICAL FIELD

The present invention relates generally to electrical circuits and, more particularly, to clock generators.

BACKGROUND

Clock generator circuits are typically employed to generate one or more clock output signals based upon a clock input signal. One drawback of conventional clock generator circuits (e.g., clock generator integrated circuits or chips is their limited programmability.

For example, there is often limited programmability in terms of input/output signal types, input/output voltage levels, frequency range, output banking structure, and/or skew control (e.g., controlling the phase of a clock output signal relative to a clock input signal). Furthermore, if programming is available, the programming may have to be performed by pin strapping, which is difficult to implement, inflexible, and may require the utilization of a number of pins.

As an example of limited programmability, skew control may only be available on a per bank basis and may be limited to only very coarse skew adjustments. If the skew steps are too coarse, for example, expensive and time-consuming trace length adjustments may be necessary on the printed circuit board.

Another drawback of conventional clock generator circuits is their lack of support for joint test action group (JTAG) or other automated testing. Consequently, it can often be cumbersome, time-consuming, and expensive to test a circuit board having clock generator circuits and other components (e.g., microprocessors, field programmable gate arrays (FPGAs), or complex programmable logic devices (CPLDs)). As a result, there is a need for improved skew control and clock generation techniques.

SUMMARY

Systems and methods are disclosed herein to provide improved skew control techniques for clock generation. For example, in accordance with an embodiment of the present invention, a clock generator chip is provided that is configurable and in-system programmable and which includes a flexible skew control architecture. The skew control may be applied on a bank or a pin basis, provide coarse and fine skew adjustments, and provide multiple sets of profiles or skew settings.

The clock generator chip may be configurable by employing on-chip electrically erasable memory (e.g., electrically erasable programmable read only memory (EEPROM)). The clock generator chip may also provide programmable input circuits, programmable output circuits, and/or permit a JTAG boundary scan. The programmable input and output circuits permit a wide variety of voltage levels, signal types, and frequency range. The clock generator chip may also have flexible output banking structures (e.g., flexible bank granularity) and a programmable output impedance.

More specifically, in accordance with one embodiment of the present invention, a clock generator includes an input circuit adapted to selectively receive an input signal and modify a frequency of the input signal by a first programmable amount to generate a first input signal; a feedback loop circuit adapted to receive a feedback signal and modify a frequency of the feedback signal by a second programmable amount to generate a second input signal; a phase-locked loop core adapted to receive the first input signal and the second input signal and provide a first signal; a divider circuit adapted to receive the first signal and modify a frequency of the first signal to generate a plurality of second signals having programmable frequencies; an output circuit adapted to select from the plurality of second signals and provide at least one output signal; and a skew control circuit adapted to selectively apply skew to the output signal by a third programmable amount, wherein the first, second, and third programmable amounts and the programmable frequencies are determined by data selected from electrically erasable memory.

In accordance with another embodiment of the present invention, an integrated circuit includes means for selecting from a plurality of input signals and generating a first input signal having a configurable frequency; means for selecting from a plurality of feedback signals and generating a second input signal having a configurable frequency; a phase-locked loop core adapted to receive the first input signal and the second input signal and generate a first signal; means for receiving the first signal and generating a plurality of second signals having configurable frequencies; means for selecting from the second signals and providing a plurality of output signals; and means for selectively skewing each of the output signals and at least one of the feedback signals.

In accordance with another embodiment of the present invention, a method of generating clock signals includes receiving an input signal, wherein the input signal may be a single-ended signal type or a differential signal type; modifying a frequency of the input signal by an amount determined from a first set of data selected from memory to provide a first input signal; receiving a feedback signal; modifying a frequency of the feedback signal by an amount determined from a second set of data selected from the memory to provide a second input signal; aligning a frequency and/or a phase of the first input signal and the second input signal to provide a first signal; modifying a frequency of the first signal to generate a plurality of second signals having frequencies determined from a third set of data selected from the memory; selecting from the second signals a plurality of output signals, which have programmable voltage levels and signal types; and applying skew to the output signals by an amount determined from a fourth set of data selected from memory.

In accordance with another embodiment of the present invention, a clock generator includes an input circuit adapted to receive an input signal and provide the input signal to a phase-locked loop; a phase-locked loop (PLL) adapted to receive the input signal from the input circuit and to generate in response an output signal; an output circuit adapted to receive the output signal from the PLL and provide the output signal as a clock signal; a first skew control circuit coupled to the PLL and adapted to generate a set of coarse skew adjustments and a set of fine skew adjustments; and a second skew control circuit programmable to select and apply one of the skew adjustments to the output signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 15 shows a block diagram illustrating an exemplary output boundary scan cell circuit for a clock generator circuit in accordance with an embodiment of the present invention.

FIG. 16 shows a block diagram illustrating an exemplary voltage controlled oscillator circuit with taps in accordance with an embodiment of the present invention.

The preferred embodiments of the present invention and their advantages are best understood by referring te the detailed description that follows. It should be appreciated that like reference numerals are used to identify like elements illustrated in one or more of the figures.

DETAILED DESCRIPTION

Figure 1:
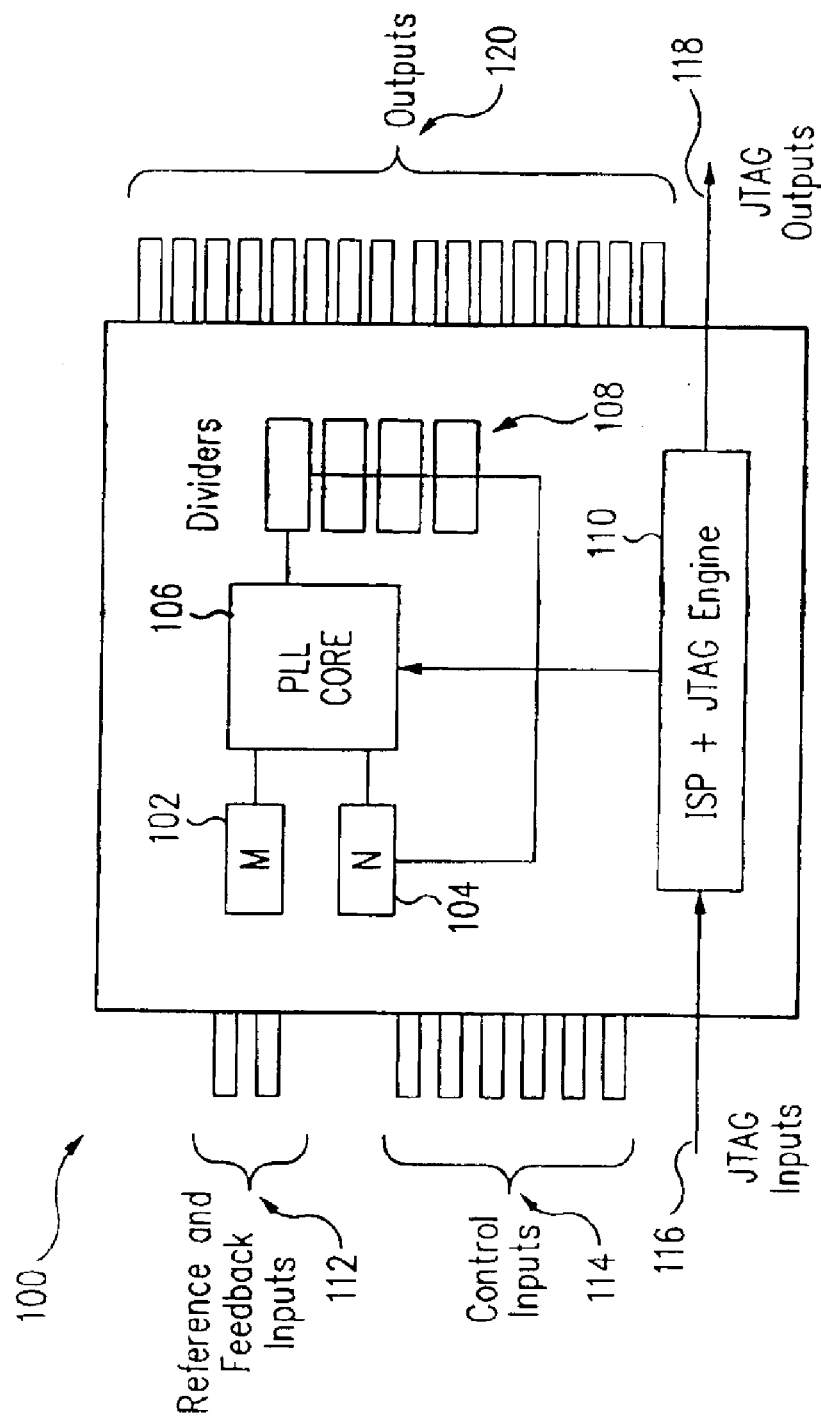
FIG. 1 shows a block diagram illustrating a clock generator circuit in accordance with an embodiment of the present invention.

FIG. 1 shows a block diagram illustrating a clock generator circuit 100 in accordance with an embodiment of the present invention. Clock generator circuit 100 may be formed as a separate integrated circuit (chip) or formed as part of a larger integrated circuit to provide clock signals (internally or externally), while the larger chip also performs its other intended functions.

Clock generator circuit 100 includes an input clock divider (M) 102, a feedback loop divider (N) 104, a phase-locked loop (PLL) core 106, dividers 108, and in-system programmable (ISP) and JTAG circuits 110. Clock generator circuit 100 receives reference signals and external feedback signals via leads 112, control signals via leads 114, and JTAG or ISP input signals via leads 116. Clock generator circuit 100 provides output signals via leads 120 and JTAG and other signals via leads 118.

In general, clock divider 102 modifies a frequency of an input signal, such as a reference clock signal, by a programmable and selectable amount and provides the input signal to PLL core 106, while feedback loop divider 104 divides an external or internal feedback signal by a programmable and selectable amount and provides the feedback signal to PLL core 106. PLL core 106 provides frequency and/or phase lock based on the signals provided by clock divider 102 and feedback loop divider 104 and generates an output signal, which is divided by a programmable amount by dividers 108 to provide selectable output signals via leads 120. It should be understood that clock divider 102 feedback loop divider 104 and divider 108 may be designed to multiply, divide, and/or leave unchanged a frequency of an input signal depending upon the desired application.

Clock generator circuit 100 is in-system programmable and configurable (e.g., by electrically erasable memory) to provide a flexible clock generation system. For example, input signals received by leads 112 and 114 may be of various signal types (e.g., LVCMOS, LVTTL, SSTL, HSTL, LVDS, and LVPECL) and voltage levels (e.g., 1.8V, 2.5V, and 3.3V). PLL core 106 along with clock divider 102, feedback loop divider 104, and dividers 108 are also programmable and configurable to provide various selectable clock frequencies. Output signals may also be of various signal types and voltage levels, as discussed similarly above for the input signals, and also provide a programmable impedance control. Circuits 110 provide the ISP functionality and test functionality for clock generator circuit 100.

Figure 2:
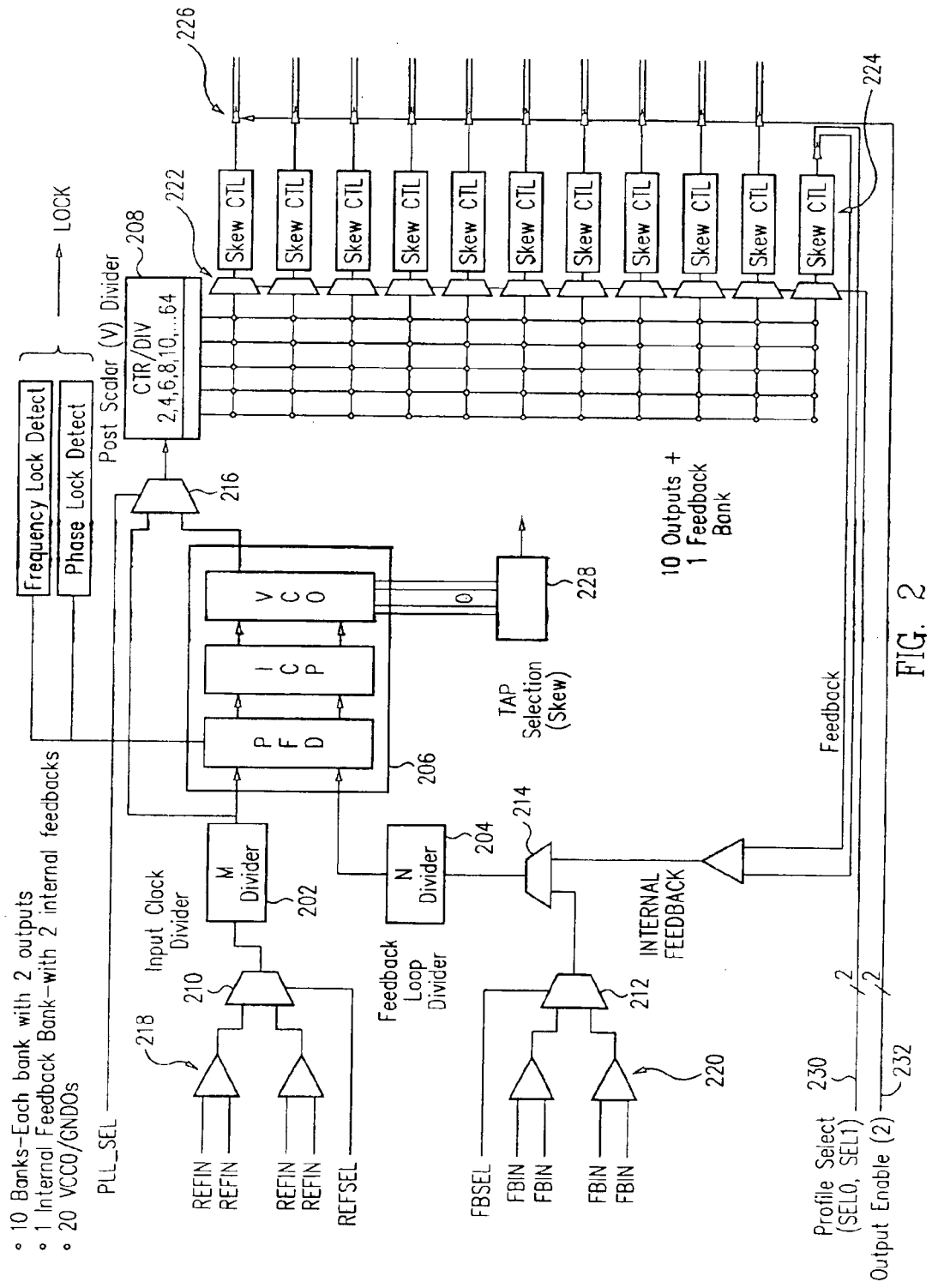
FIG. 2 shows a block diagram illustrating a more detailed exemplary implementation of the clock generator circuit of FIG. 1 in accordance, with an embodiment of the present invention.

FIG. 2 shows a block diagram illustrating a clock generator circuit 200, which is a more detailed exemplary implementation for portions of clock generator circuit 100 of FIG. 1. Clock generator circuit 200 selects a desired reference input signal (REFIN) via input circuits 218 and a multiplexer 210 to provide to a clock divider 202, which programmably divides its frequency and provides the reference input signal to a PLL core 206 and to a multiplexer 216. Multiplexer 216 selects between clock divider 202 (e.g., during system test or debug purposes) and PLL core 206 to route their corresponding output signal to a divider 208.

A multiplexer 212 selects a desired feedback signal (FBIN), which is provided to a multiplexer 214 that selects between the feedback signal (via input circuits 220- and an internal feedback signal and provides a selected signal to a feedback loop divider 204. Feedback loop divider 204 programmably divides a frequency of the selected signal and provides it to PLL core 206.

PLL core 206 includes a phase frequency detector (PFD), a current charge pump and loop filter (ICP), and a voltage controlled oscillator (VCO). PLL core 206 may also have a programmable output frequency range by utilizing an internal voltage divider. A lock signal is provided when PLL core 206 achieves frequency and phase lock.

Divider 208 divides a signal received from multiplexer 216 and provides clock signals having different frequencies that are selectable by multiplexers 222 and driven out by output circuits 226. Skew control for the output signals may be provided by skew circuits 224 and skew circuit 228, with details for an exemplary implementation for skew control described in further detail below (e.g., in reference to FIGS. 16–19).

An output enable signal 232 is provided to each output circuit 226. For example, if output enable signal 232 is asserted, then the output signals from output circuit 226 are synchronously enabled. If output enable signal 232 is deasserted, then the output signals from output circuit 226 are synchronously disabled.

In general, clock generator circuit 200 provides programmable features, such as programmable frequency range, programmable input/output signal types and voltage levels, and programmable output impedance. PLL core 206 may be a fully integrated, high performance PLL core that can be configured as a zero delay buffer, a multiplier or a divider, and have programmable output frequencies. For example, clock generator circuit 200 may provide 20 buffered output signals from one master clock, with each buffered output signal driving a terminated transmission line.

Clock divider 202, feedback loop divider 204, and divider 208 are each programmable to allow very flexible output-to-input frequency ratios (e.g., 1 to 32). Furthermore, an external feedback path allows clock generator circuit 200 to achieve a zero delay between the reference input and the selected feedback output clock signal.

In this example (FIG. 2), output circuits 226 are arranged in ten banks, each with two possible output signal paths (e.g., one differential signal or two single-ended signals per bank). As shown, an additional bank is included to provide an internal feedback path for feedback loop divider 204. Each bank may have its own separate supply voltage (Vcco) and ground (Gndo) pins so that the output signals of the bank may support various output voltage levels (e.g., 1.8V, 2.5V, and 3.3V) independently of the other banks. Thus, for this example (ten banks, two output signal paths per bank), there are twenty possible output signals (if the banks are all configured as single-ended), which require ten separate supply voltages and grounds.

Input circuits 218 and 220 and output circuits 226 may be configured independently to support single-ended or differential standards (e.g., LVTTL LVCMOS, HSTL, SSTL, LVPECL, and LVDS), which permits single-ended input to single-ended output, single-ended input to differential output, differential input to single-ended output, and differential input to differential output for clock generator circuit 200. Output circuits 226 may also have a programmable output impedance (e.g., to accommodate transmission-line impedance from 40 to 70 ohms in 5 ohm increments). Thus, output circuits 226 may be able to drive transmission-lines impedance from 40 to 70 ohms in 5 ohms external on-board series resistors, which reduces parts and implementation costs along with implementation time and effort. Output circuits 226 may also provide an independent clock invert function (e.g., via a 2-to-1 multiplexer with a true and a complement input terminal).

A profile select signal 230, as shown in FIG. 2, is provided to, for example, control multiplexers 222 and also clock divider 202 and feedback loop divider 204. Profile select signal 230 controls multiplexers 222 to perform frequency selection by, for example, selecting from up to four different frequencies from divider 208. Likewise profile select signal 230 may also control clock divider 202 and feedback loop divider 204 by selecting from one set of four registers that provide corresponding control signals for clock divider 202 and feedback loop divider 204. In addition, profile select signal 230 may also control the skew settings by selecting, for example, one set of four registers that define the various skew parameters.

Figure 3:
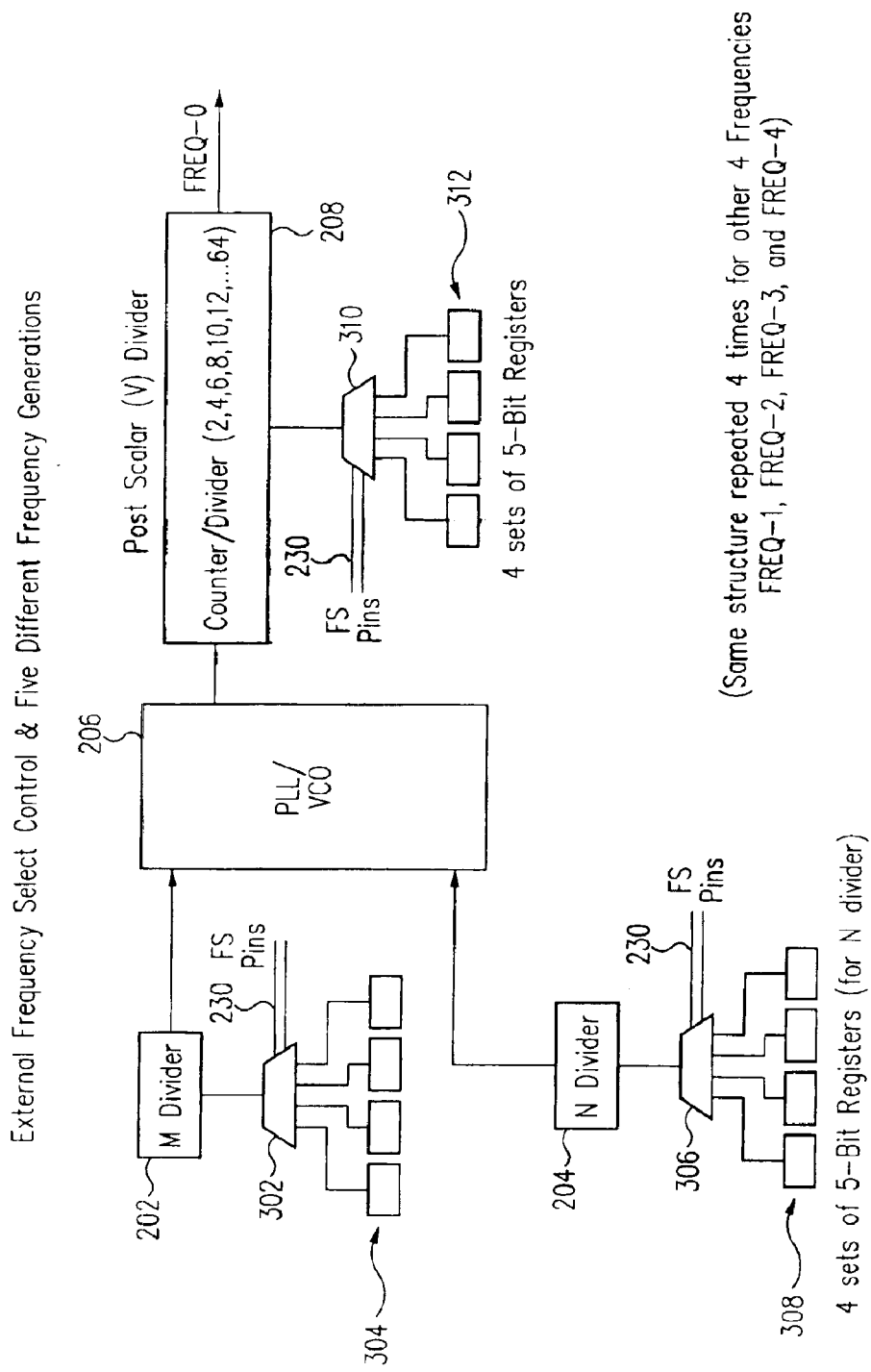
FIG. 3 shows a block diagram illustrating frequency selection for a clock generator circuit in accordance with an embodiment of the present invention.

For example, FIG. 3 shows a block diagram illustrating frequency selection for clock generator circuit 200 in accordance with an embodiment of the present invention. Profile select signal 230 is routed to multiplexers 302, 306, and 310 corresponding to clock divider 202, feedback loop divider 204, and divider 208, respectively. A number of registers 304, 308, and 312 are associated with clock divider 202, feedback loop divider 204, and divider 208, respectively, to select a desired division ratio.

As an example, clock divider 202 and feedback loop divider 204 may each have division ratios from 1 to 32 and divider 208 may have division ratios from 2, 4, 6, ..., to 64. Profile select signal 203 (e.g., a 2-bit signal) controls multiplexer 302 to select signals from one of four 5-bit registers 304, which determines the division ratio for clock divider 202. Similarly, profile select signal 203 controls multiplexers 306 and 310 to select signals from one of four 5-bit registers 308 and 312, which determine the division ratio for feedback loop divider 204 and divider 208, respectively. For example, registers 308 may store four 5-bit values, selected from the range of 00000 to 11111, which correspond to division ratios from 1 to 32, respectively.

Registers 304, 308, and 312 are each configurable to store 4 of 32 possible settings for clock divider 202, feedback loop divider 204, and divider 208. Thus, a user may configure registers 304, 308, and 312 with appropriate settings to produce desired clock frequencies, which are selectable via profile select signal 203. These settings stored by registers 304, 308, and 312 may be changed by in-system programming techniques whenever a user desires. Registers 304, 308, and 312 may, for example, be electrically erasable registers (e.g., formed by EEPROM).

Figure 4:
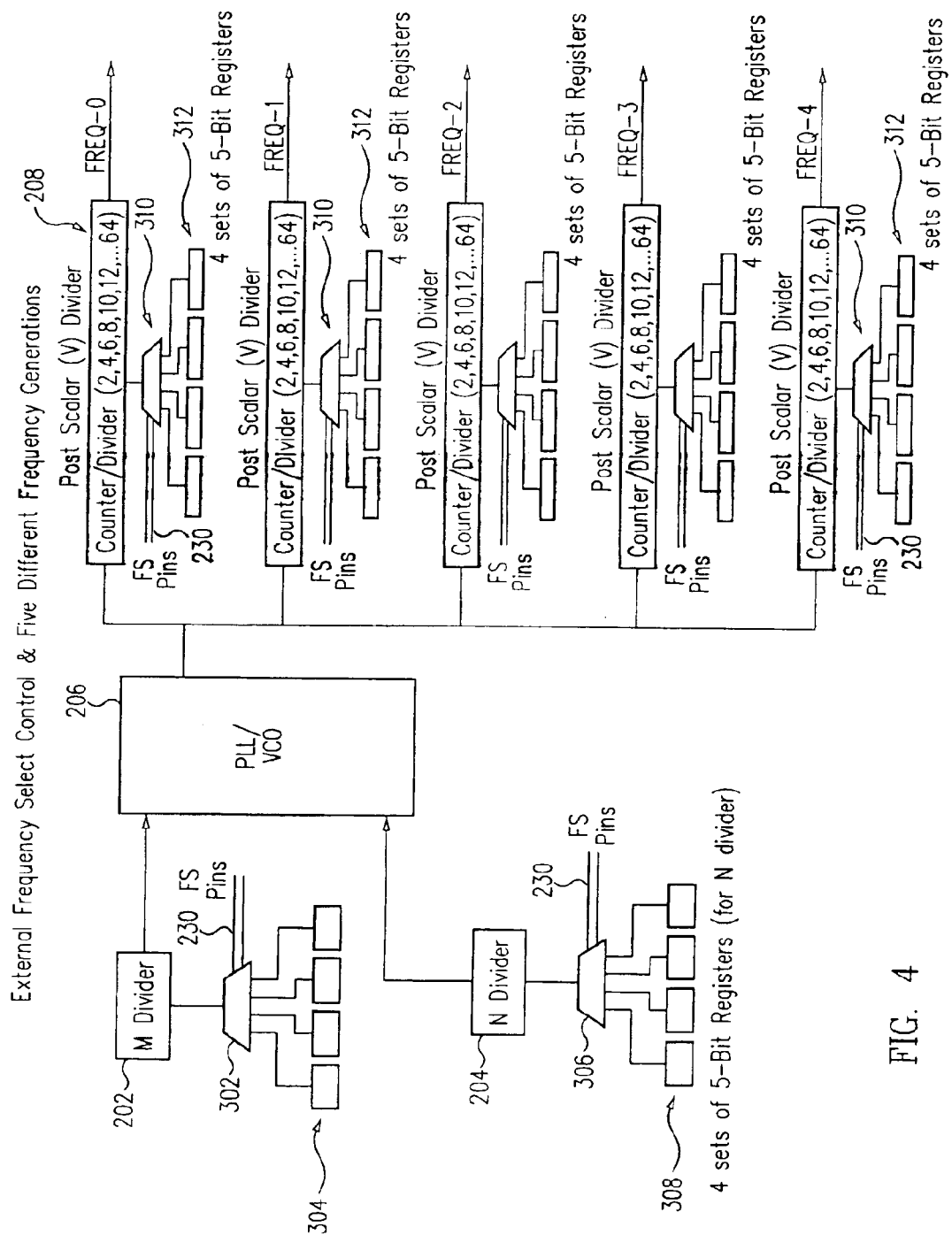
FIG. 4 shows a block diagram illustrating frequency selections for a clock generator circuit in accordance with an embodiment of the present invention.

These techniques may be applied a number of times, depending upon the number of selectable output clock frequencies desired. For example, if five different output clock frequencies are desired, divider 208, multiplexer 310, and registers 312 may be repeated four more times (as shown in FIG. 4) to provide the five possibly different output clock frequencies (freq-0 through freq-4). Thus, profile select signal 230 (labeled FS pins) may function as a select signal for multiplexer 310 for tapping 1 of 32 different tap points (frequency output points) of divider 208 to select each frequency.

By having a number of banks and a number of frequencies to select from, a flexible banking output structure may be provided. For example, if ten banks and five frequencies are available, a user can select how to group the banks and the number of output signals of various frequencies based upon a, particular application. As an example, the ten banks may be configured to operate as one bank (e.g., same output voltage levels, signal types, and output impedance) at one frequency to provide 20 output signals. As another example, the ten banks may be configured to operate as two banks at one frequency or at two different frequencies to provide 10 output signals from each bank. Thus, various combinations of banking output structure, voltage levels, signal types, frequencies, output impedance, etc. may be selected based upon techniques discussed herein in accordance with one or more embodiments of the present invention.

For this particular implementation having ten banks, there could be up to ten or twenty different frequencies depending upon whether the banks are configured as differential or single-ended, respectively. However, the number of different frequencies available for the banks may be limited. As shown in FIG. 2, profile select signal 230 controls multiplexers 222 to 5 select from among the possible output clock frequencies generated by divider 208. Consequently, the number of different frequencies available simultaneously is limited by the number of dividers 208 (or number of different frequencies provided by divider 208).

As discussed above for one exemplary implementation, the frequency range of operation for clock generator circuit 200 is determined by profile select signal 230 and configuration bits stored by registers 304, 308, and 312. Thus, four different profiles may be selected for each bank by profile select signal 230.

It should be understood that numerous modifications and variations are possible with respect to one or more of the embodiments discussed in reference to FIG. 2. For example, rather than be limited by profile select signal 230 having only two bits, one or more control signals may be implemented to allow the independent selection of the entire range of division ratios for clock divider 202, feedback loop divider 204, and divider 208, and also allow the selection from all of the possible frequencies from divider 208 for any of output circuits 226. However, this would require a number of additional control signal paths (e.g., external leads) along with possibly additional circuitry, board space, and implementation complexity. Thus, one or more of these disadvantages may be avoided and a user may be able to obtain desired clock signals 30 by utilizing one or more of the techniques discussed herein (e.g., as shown in FIGS. 3 and 4), including configurability and in-system programmability.

As shown in FIG. 2, input circuits 218 and 220 and output circuits 226 are provided to programmably support a wide range of signal types and signal levels. For example, the signal types may include un-terminated single-ended interfaces (e.g., LVTTL and LVCMOS), terminated single-ended interfaces (e.g., SSTL and HSTL, which require a voltage reference signal and possibly a termination voltage signal), and differential interface standards (e.g., LVDS and LVPECL). The signal types may also include DDR and QDR memory interface signals, such as differential HSTL or SSTL (e.g., to drive SDRAMs and SRAMs).

Figure 5:
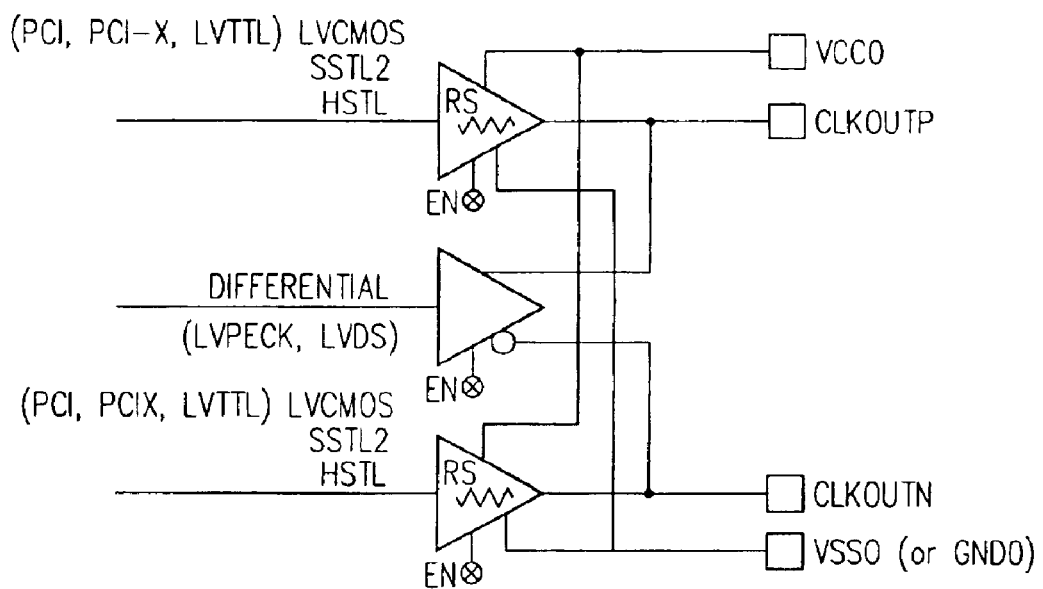
FIG. 5 shows a block diagram illustrating an exemplary output circuit for a clock generator circuit in accordance with an embodiment of the present invention.
Figure 6:
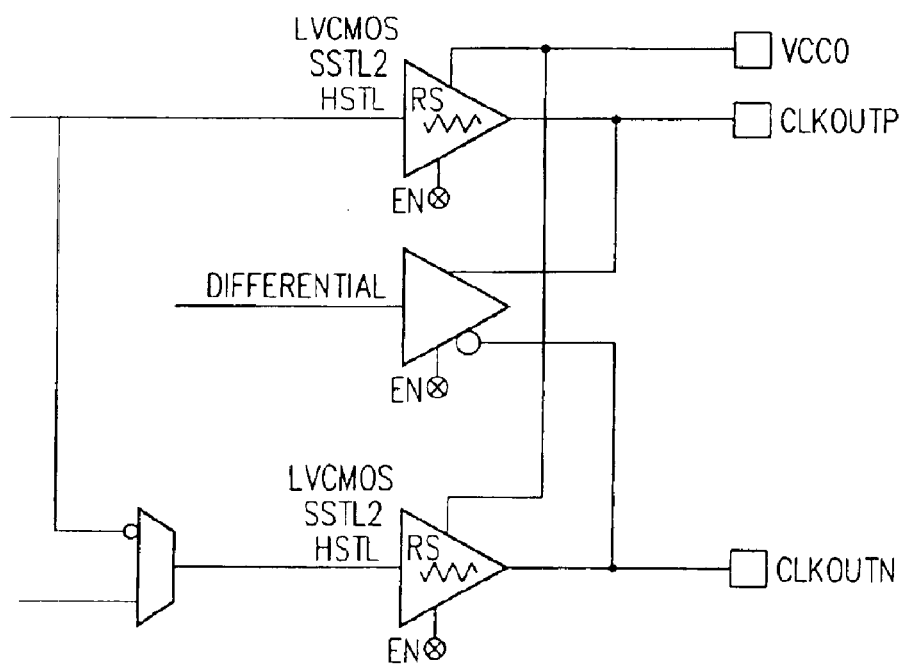
FIG. 6 shows a block diagram illustrating an exemplary output circuit for a clock generator circuit in accordance with an embodiment of the present invention.
Figure 7:
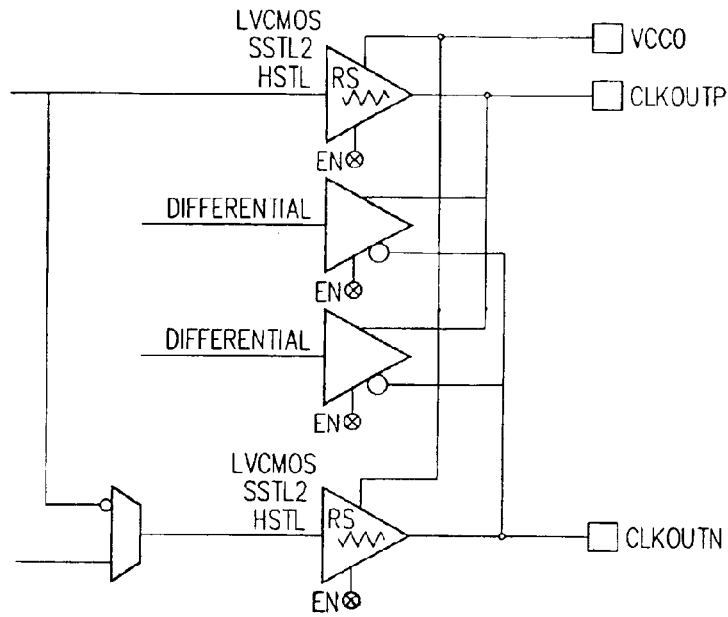
FIG. 7 shows a block diagram illustrating an exemplary output circuit with output impedance control for a clock generator circuit in accordance with an embodiment of the present invention.

For example, FIGS. 5–7 show exemplary implementations for one of output circuits 226 (i.e., for one bank) for clock generator circuit 200 of FIG. 2 in accordance with an embodiment of the present invention. FIG. 5 illustrates an exemplary implementation employing a differential output buffer in conjunction with a pair of single-ended output buffers, which may be utilized to support various signal types. FIG. 6 shows a modification to the implementation of FIG. 5 to support differential HSTL, SSTL, and LVDS with the same output buffer.

FIG. 7 shows a modification to the implementation of FIGS. 5 and 6 by including two separate differential output buffers (rather than the one differential output buffer of FIGS. 5 and 6). A variable resistance (labeled RS in FIGS. 5–7) represents a programmable output impedance of the single-ended output buffer, which may be matched to a line impedance for series termination. The output impedance, for example, may have an impedance range from 40 to 70 ohms in 5 ohm steps.

Figure 8:
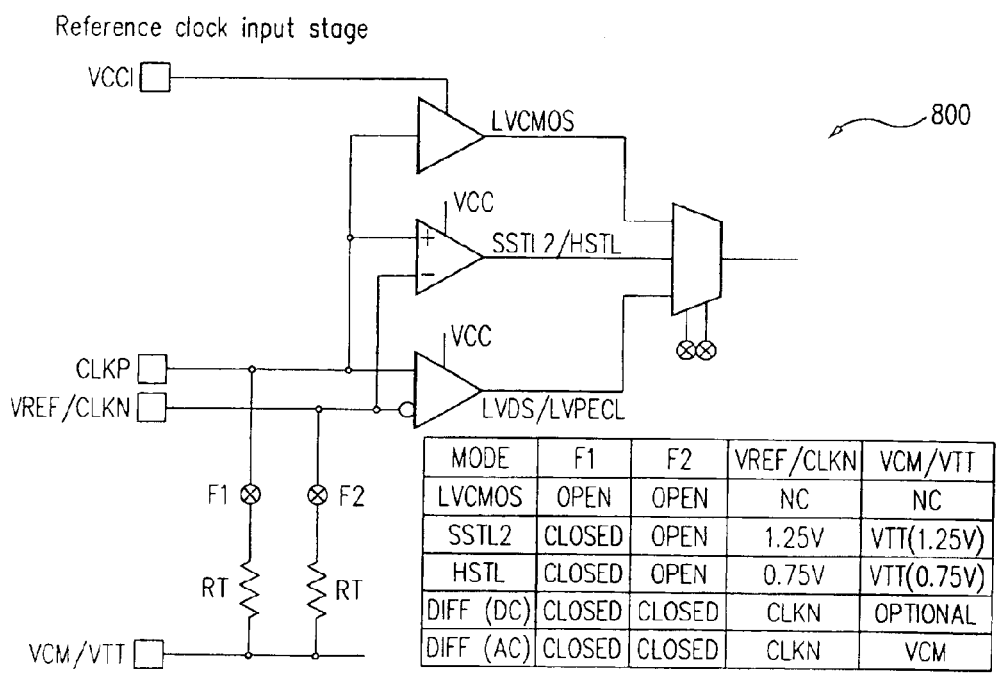
FIG. 8 shows a block diagram illustrating an exemplary input circuit for a clock generator circuit in accordance with an embodiment of the present invention.
Figure 9:
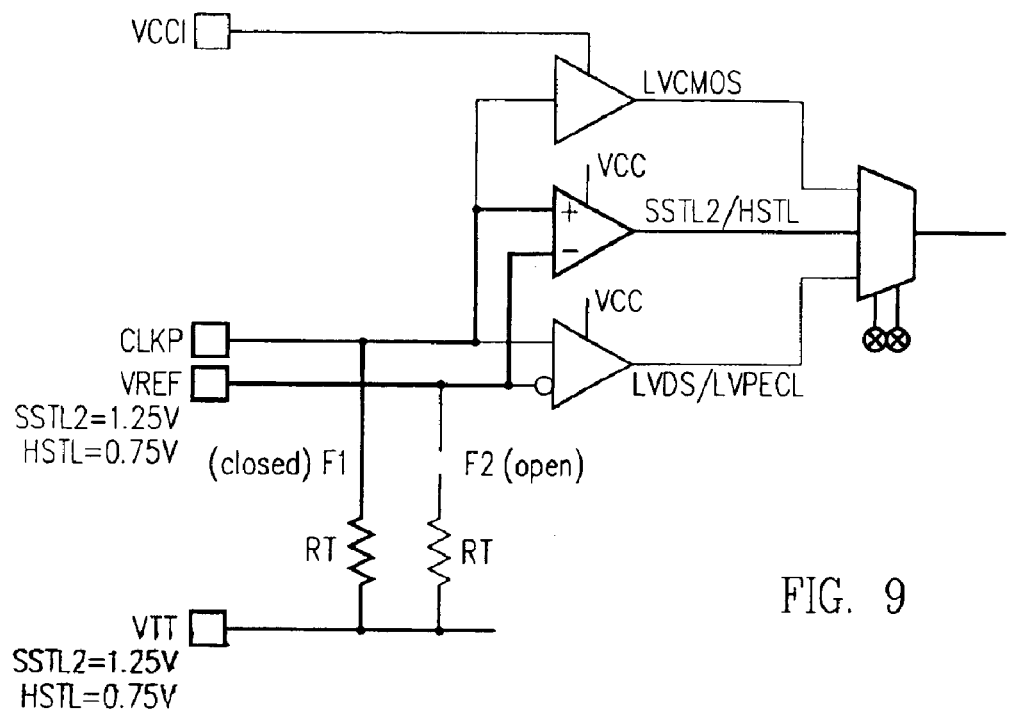
FIG. 9 shows a block diagram illustrating an exemplary input circuit for a clock generator circuit in accordance with an embodiment of the present invention.
Figure 10:
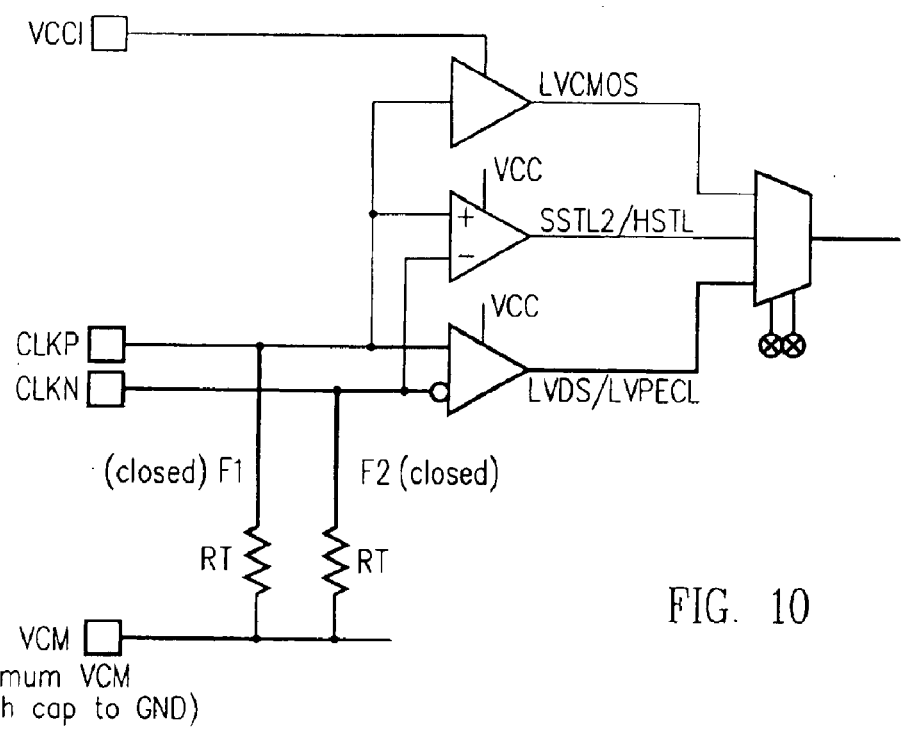
FIG. 10 shows a block diagram illustrating an exemplary input circuit for a clock generator circuit in accordance with an embodiment of the present invention.

Referring to FIG. 2, input circuits 218 and 220 may receive (for this exemplary application) four pairs of differential or four single-ended input signals. For example, when configured to receive a single-ended input signal, input circuit 218 or input circuit 220 receives a signal on one input terminal, while the other input terminal is unused or receives a reference voltage, depending upon the application or programmed input specification. FIG. 8 shows a block diagram illustrating an input circuit 800, which is an exemplary implementation for one of four input circuits 218 or 220 shown in FIG. 2 in accordance with an embodiment of the present invention. A VCM/VTT pin is provided, with VCM (common mode voltage) for differential signals and with VTT (termination voltage) for certain types of single-ended signals (e.g., HSTL). A resistance (RT) is programmable, with for example a nominal center point of 50 ohm. As an example, FIGS. 9 and 10 illustrate exemplary applications for input circuit 800.

Clock generator circuit 100 (FIG. 1) and clock generator circuit 200 (FIG. 2), in accordance with an embodiment of the present invention, may be implemented to be compliant with JTAG testing, such as IEEE 1149.1 standards (e.g., IEEE 1149.1-1993 standard). Additionally, clock generator circuits 100 and 200 may also be compliant with the IEEE 1532 standard describing configuration of programmable logic-devices.

Figure 11:
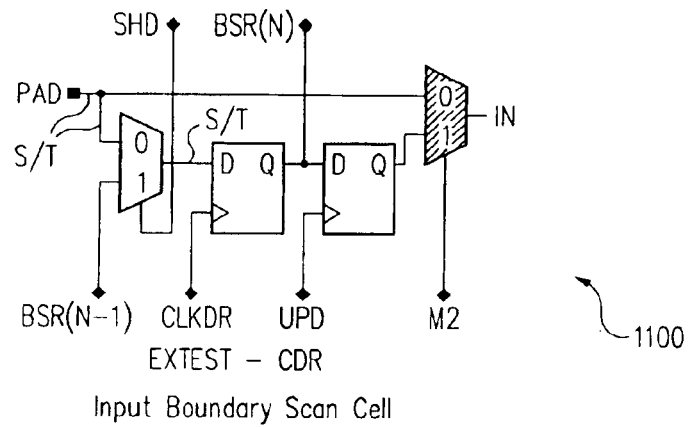
FIG. 11 shows a block diagram illustrating an exemplary input boundary scan cell circuit for a clock generator circuit in accordance with an embodiment of the present invention.

For JTAG support, FIG. 11 shows a block diagram illustrating an exemplary input boundary scan cell circuit 1100 for a clock generator circuit in accordance with an embodiment of the present invention. Circuit 1100 allows instructions to be performed, for example, as outlined in the JTAG standard (IEEE 1149.1-1993, e.g., sample/preload and EXTEST). Specifically, circuit 1100 in FIG. 11 illustrates exemplary circuit operation during an EXTEST function (capture-DR).

Figure 12:
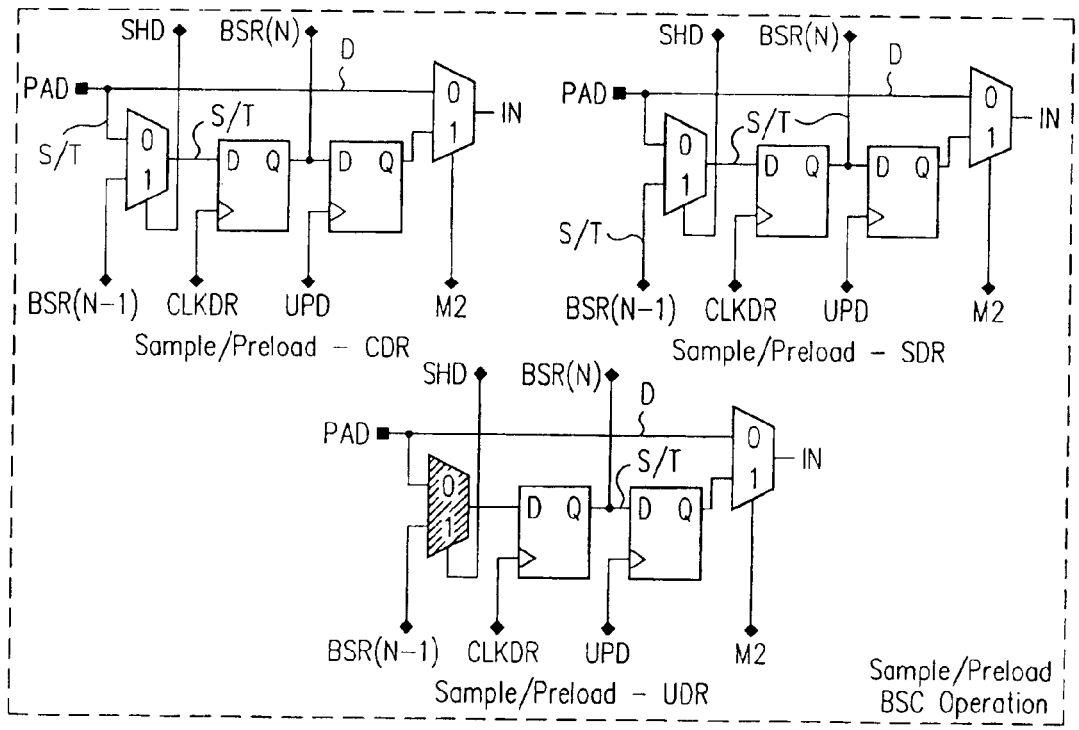
FIG. 12 shows a block diagram illustrating an exemplary input boundary scan cell circuit for a clock generator circuit in accordance with an embodiment of the present invention.
Figure 13:
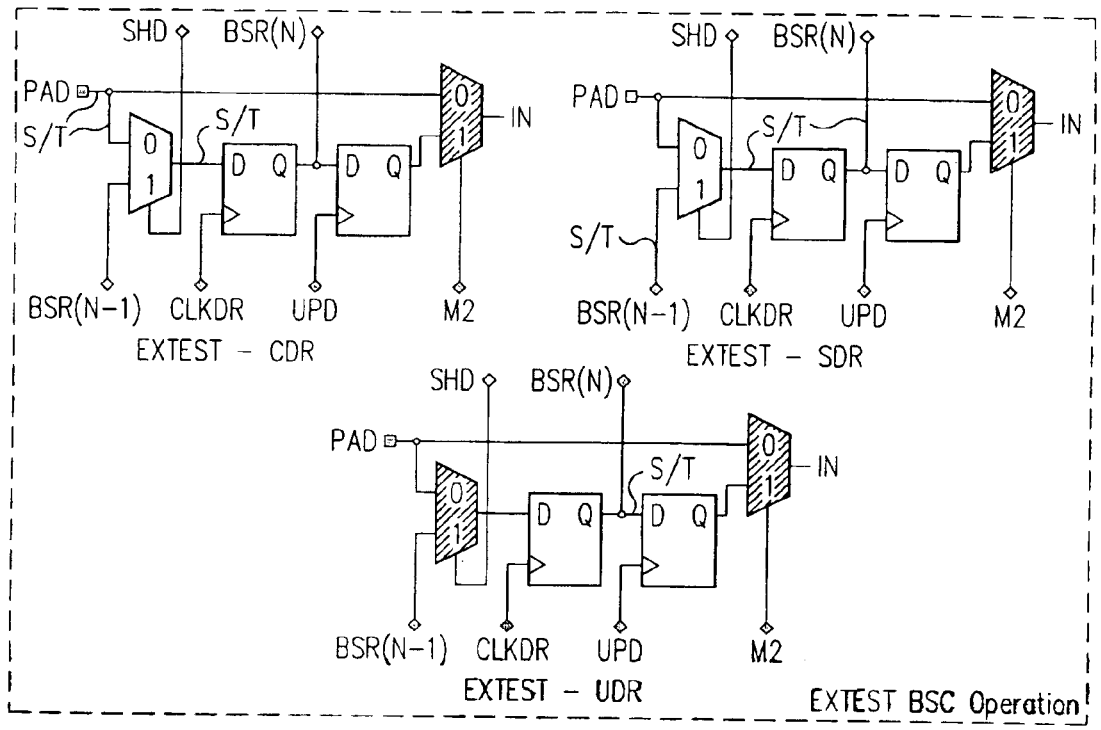
FIG. 13 shows a block diagram illustrating an exemplary input boundary scan cell circuit for a clock generator circuit in accordance with an embodiment of the present invention.
Figure 14:
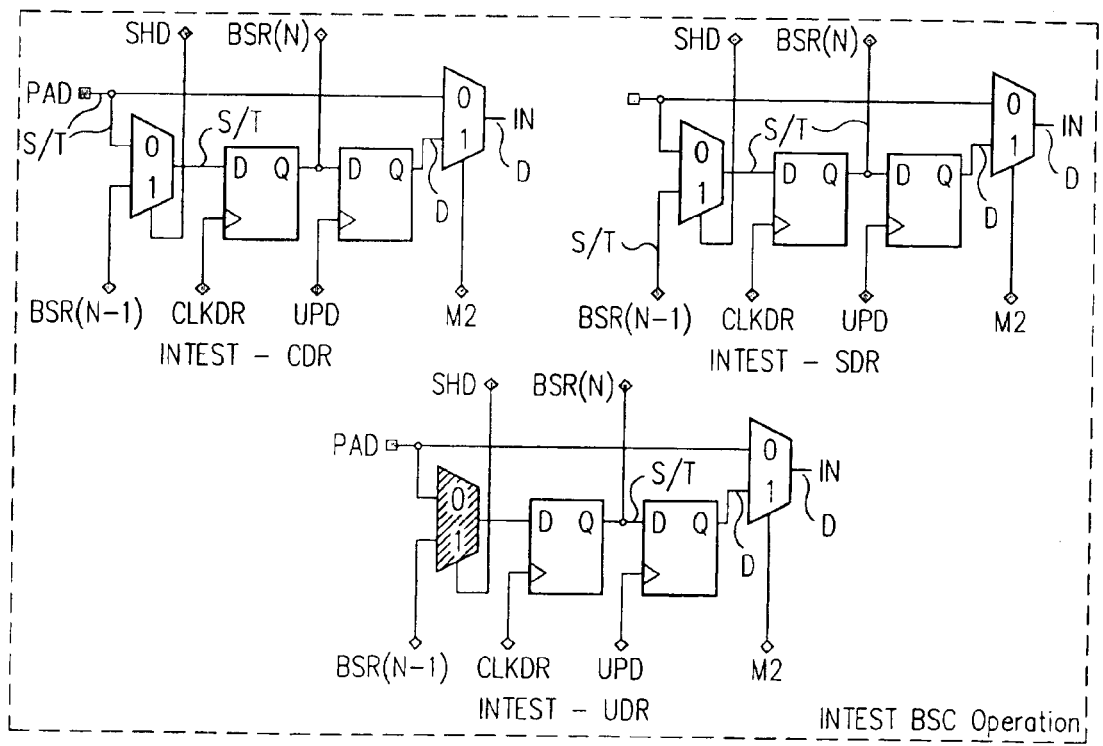
FIG. 14 shows a block diagram illustrating an exemplary input boundary scan cell circuit for a clock generator circuit in accordance with an embodiment of the present invention.

FIG. 12 illustrates exemplary circuit operation for circuit 1100 during sample/preload (for capture-DR (CDR), shift-DR (SDR), and update-DR (UDR)). Similarly, FIGS. 13 and 14 illustrate exemplary circuit operation for circuit 1100 during EXTEST (for CDR, SDR, and UDR) and INTEST (for CDR, SDR, and UDR), respectively. Note that in FIGS. 11–14, shift/test paths are indicated by "S/T" and data flow is indicated by "D" while shaded multiplexers are considered do not care for that particular situation.

Figures 15, 16:
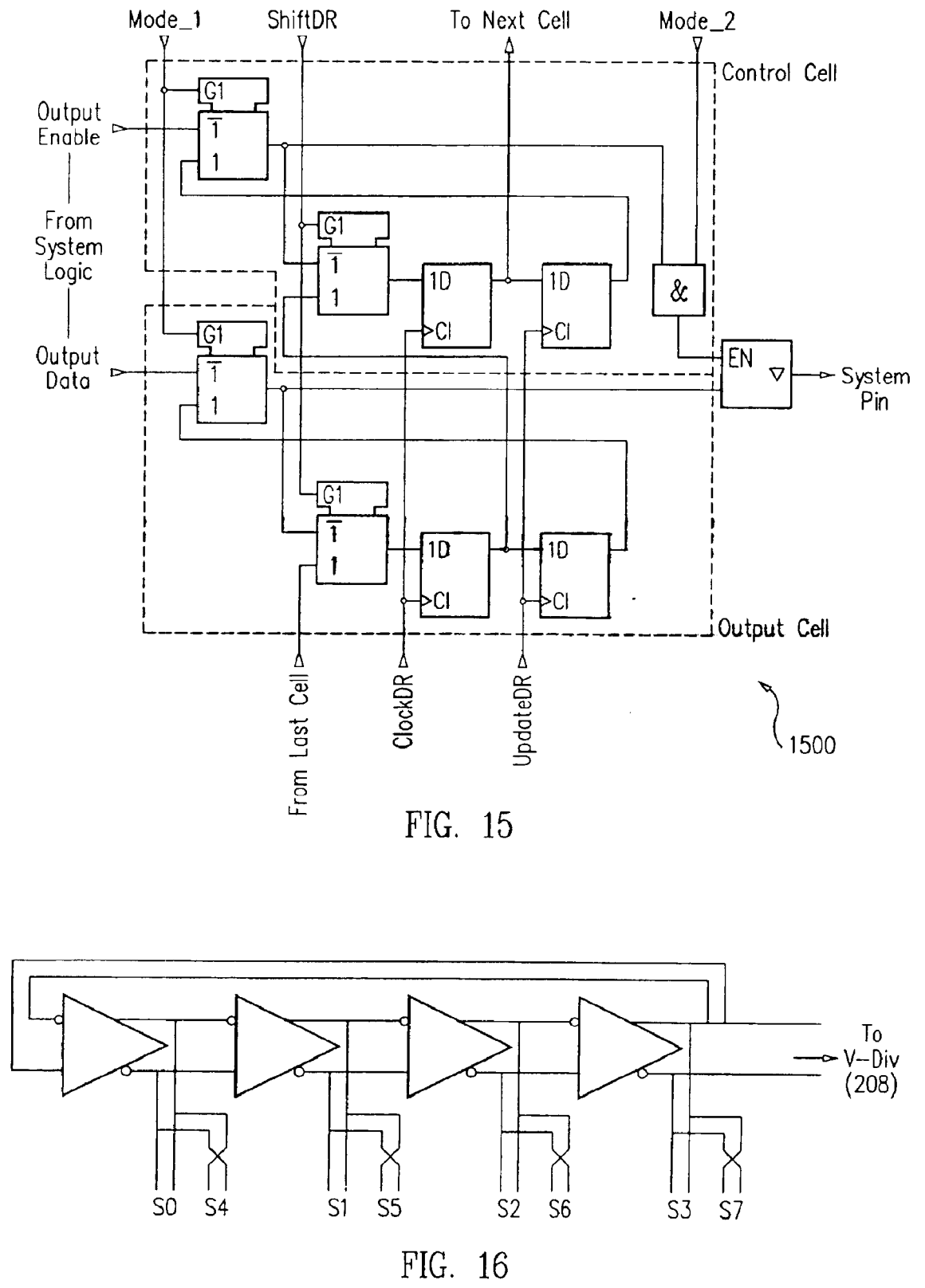

FIG. 15 shows a block diagram illustrating an exemplary output boundary scan cell circuit 1500 for a clock generator circuit in accordance with an embodiment of the present invention. Circuit 1500, for example, supports full EXTEST and modes of operation, but does not support INTEST as the pins are output only.

In general, boundary scan cells (e.g., circuit 1100 and/or circuit 1500) are inserted appropriately on all input/output paths, clock paths, and dedicated input paths, except for voltage supply leads, four dedicated 1149.1 TAP pins, and one or more (e.g., two) test pins. The boundary scan cells provide IEEE 1149.1 compliance and allow functional testing of the circuit board, on which the device (e.g., clock generator circuit 100) is mounted, through a serial scan path that can access all critical logic nodes. Internal registers may be linked internally, which allows test data to be shifted in and loaded directly onto test nodes, or test node data to be captured and shifted out for verification. The device may also be linked into a board-level serial scan path for more board-level testing.

As noted above, the device may also provide in-system programming (ISP) capability (e.g., IEEE 1532 compliant ISP). For example, the ISP capability may be provided through the boundary scan test access port. The ISP capability provides a number of significant benefits, such as for example rapid prototyping lower inventory levels, higher quality, and the ability to make in-field modifications.

Referring back to FIG. 2, it was noted that skew control for the output signals may be provided by skew circuits 224 and skew circuit 228. Skew circuit 228, for example, provides skew steps that are derived from taps of the VCO of PLL core 206 and, therefore, are a function of the frequency of the VCO. As an example, FIG. 16 illustrates eight taps (labeled S0 through S7) taken from an exemplary VCO that may be utilized by skew circuit 228 to provide skew steps for skew circuits 224.

Figure 17:
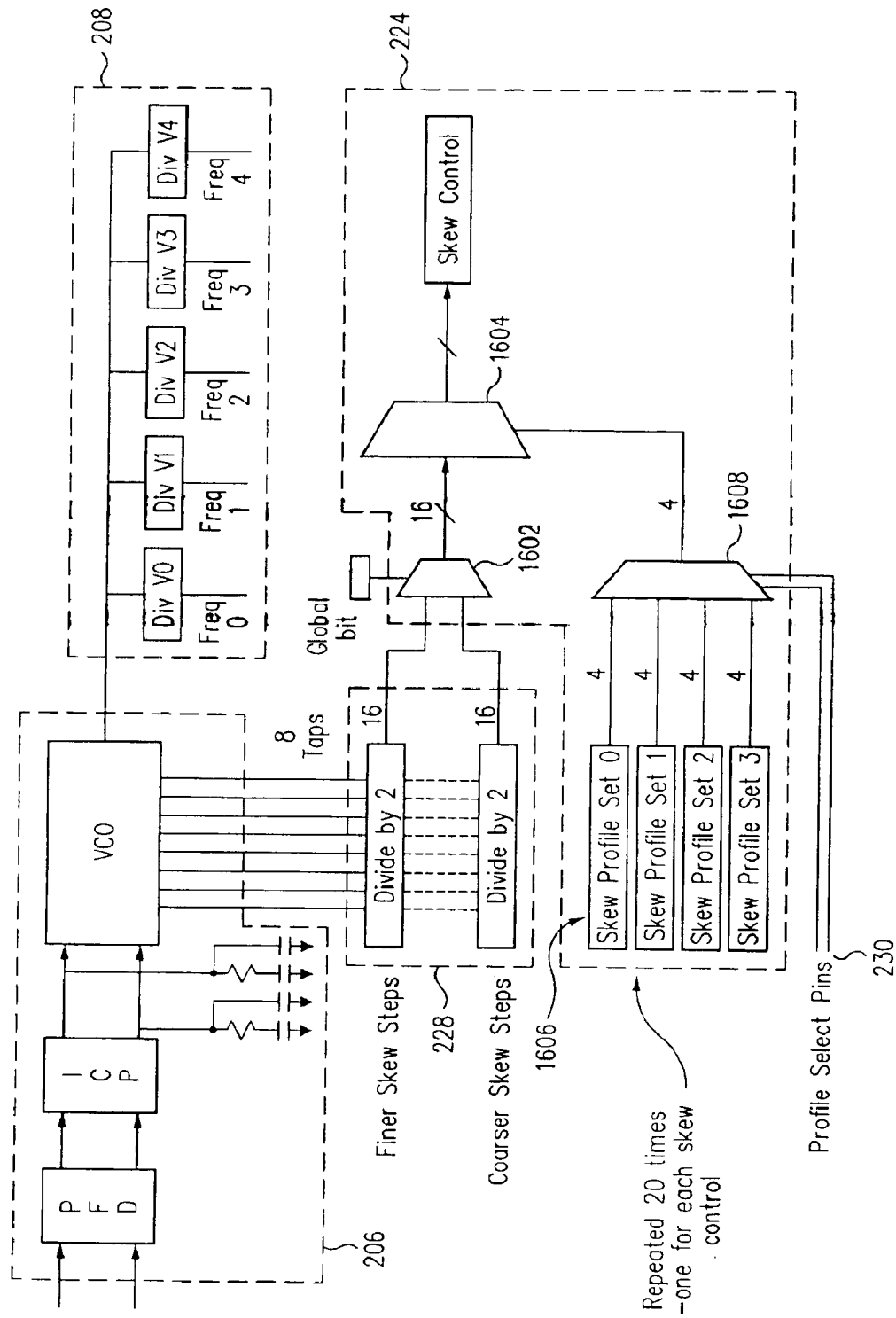
FIG. 17 shows a block diagram illustrating an exemplary implementation of skew control for a portion of FIG. 2 in accordance with an embodiment of the present invention.

FIG. 17 shows a block diagram illustrating an exemplary implementation for skew circuit 228 and skew circuits 224 in accordance with an embodiment of the present invention. As shown, PLL core 206 provides eight tap signals to skew circuit 228, which includes divide-by-2 circuits for providing sixteen fine skew steps and sixteen coarse skew steps.

Each skew circuit 224 (e.g., one associated with each of the output signals) receives the fine skew steps and the coarse skew steps from skew circuit 228 and selects, via a multiplexer 1602, whether to apply fine or coarse skew control, respectively. A multiplexer 1604 then is employed to select among the fine skew steps or the coarse skew steps, depending upon which is provided by multiplexer 1602.

Multiplexer 1602 may be controlled by a global bit signal routed to each skew circuit 224 or multiplexer 1602 may be controlled individually for each skew circuit 224. Multiplexer 1602 may also be placed within skew circuit 228 so that only the coarse or fine skew steps are provided to each skew circuit 224.

Registers 1606 store skew profile settings, which may be selected by profile select signal 230 via multiplexer 1608. An output signal from multiplexer 1608 controls multiplexer 1604 for selecting among the fine skew steps or the coarse skew steps. Registers 1606 may, for example, be four 4-bit registers, which are configurable to respectively store 4 of 16 possible values for selecting the fine or coarse skew step. As an example, the 16 fine skew steps may range from 0 to 3000 picoseconds (in 200 picosecond steps) and the 16 coarse skew steps may range from 0 to 6000 picoseconds (in 400 picosecond steps). Registers 1606 may be formed by EEPROM, as discussed similarly for registers 304, 308, and 312 of FIG. 3, and be configurable by a user to the desired values.

Figure 18:
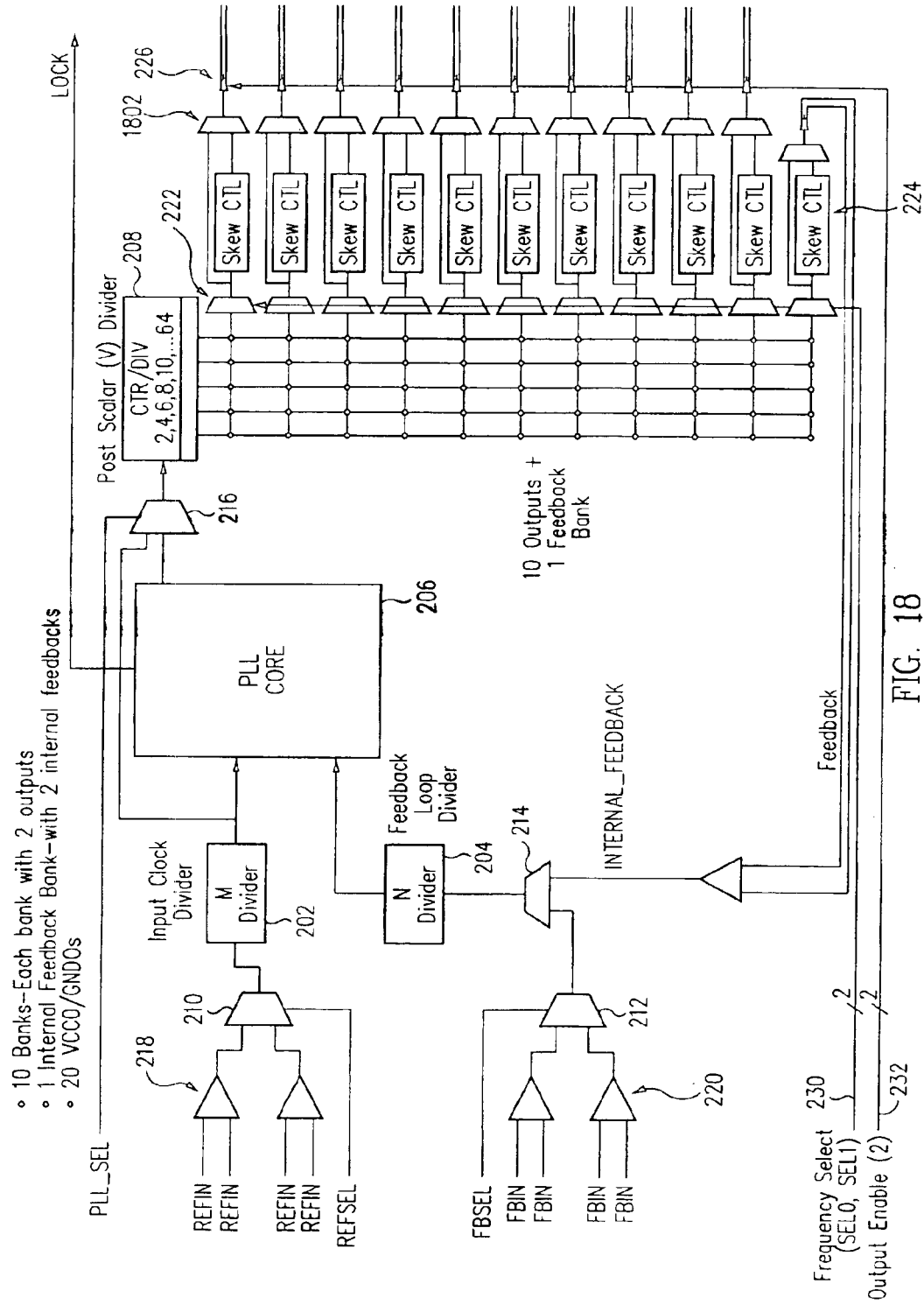
FIG. 18 shows a block diagram illustrating a more detailed exemplary implementation of the clock generator circuit of FIG. 1 for skew control in accordance with an embodiment of the present invention.
Figure 19:
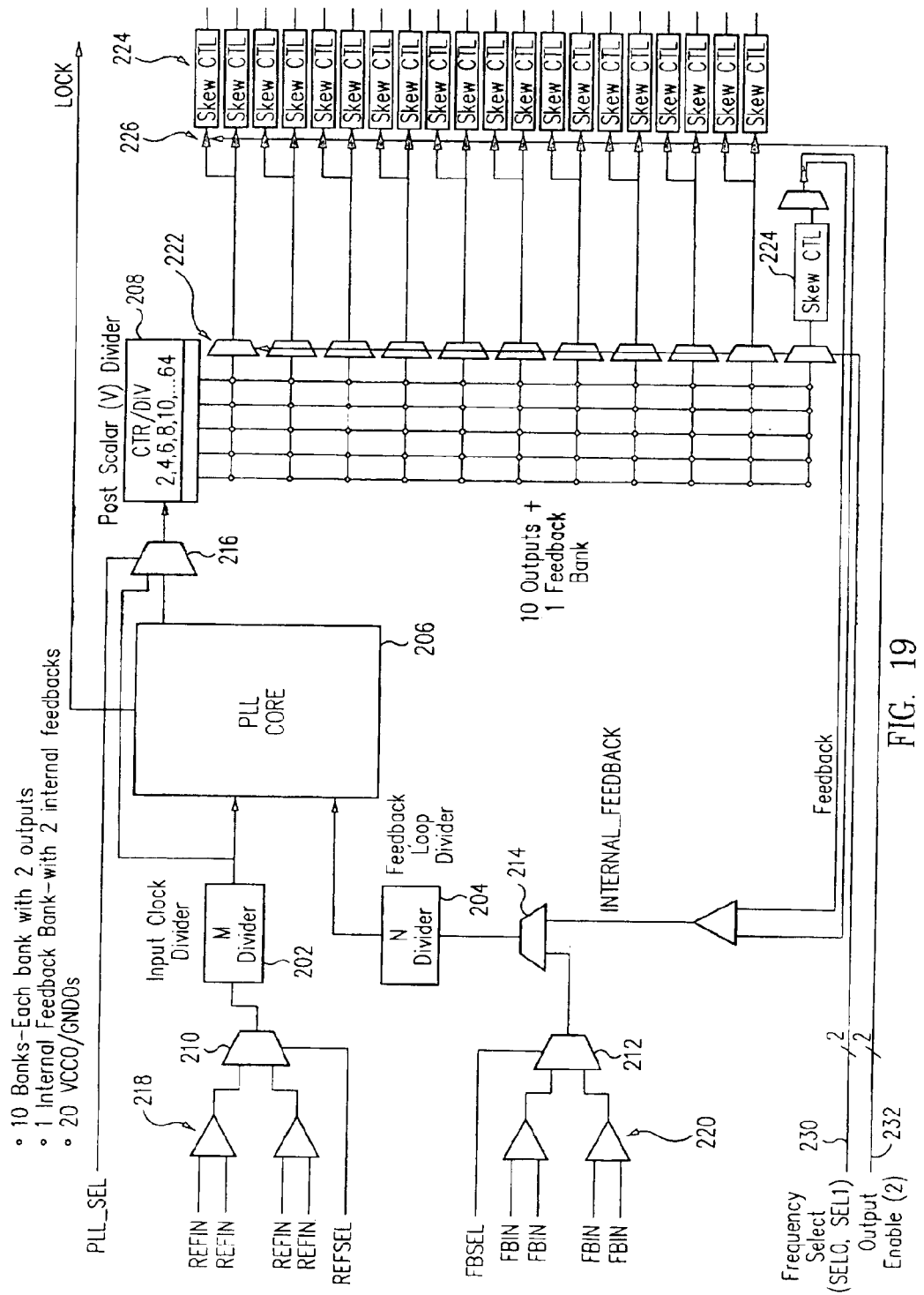
FIG. 19 shows a block diagram illustrating a more detailed exemplary implementation of the clock generator circuit of FIG. 1 for skew control in accordance with an embodiment of the present invention.

Skew control may be applied on a per bank basis, as illustrated in an exemplary fashion in FIG. 18 (e.g., for differential output signals), or applied on a per pin basis as illustrated in an exemplary fashion in FIG. 19 (e.g., for single-ended output signals). Skew control may also be bypassed, such as by utilizing multiplexers 1802 as shown in FIG. 18. Thus, for the exemplary implementation of ten banks with one or two possible output signals per bank, there would be twenty of skew circuits 224 (e.g., the exemplary implementation of skew circuit 224 shown in FIG. 17 repeated twenty-times within clock generator circuit 200).

By providing a programmable skew control for the output signals to create signal lead or lag relative to the selected reference signal (i.e., the feedback signal via input circuits 220 or the internal feedback signal), the timing may be optimized for applications; such as high-performance computer and communication systems. The internal feedback path may also employ skew control (e.g., as shown in FIGS. 2, 18, and 19) and the delay from an input pad for the reference input signal, through multiplexer 210, to PLL core 206 may be matched closely to the delay through the feedback path (e.g., from an input pad for the reference signal, through multiplexer 214 and feedback loop divider 204, to PLL core 206).

In the above example in reference to FIG. 17, profile select signal 230 is employed to select the desired skew value from registers 1606. Consequently, profile select signal 230 controls the selection of four different profiles for each bank of output signals (e.g., selection of one of four values for divider 202, feedback loop divider 204, dividers 208, and skew circuits 224). Alternatively, one or more additional control signals may be employed to control the selection of skew values from registers 1606.

In general, the flexible skew control architecture, discussed above in accordance with one or more embodiments of the present invention, provides a flexible output banking structure for skew control. The skew control generation may employ coarse or fine steps over a flexible skew range and application on a per bank or on a per pin basis. Multiple sets of registers are available for selection of the desired skew value and to provide flexible skew control. The register values may be reconfigured by a user to provide additional flexibility.

In accordance with one or more embodiments of the present invention, a configurable (e.g., via EEPROMs) and in-system programmable clock generator (e.g., circuit or chip) is provided. The clock generator may provide flexible programmable inputs that permit various input voltage levels, input signal types, and input frequency range. The clock generator may provide flexible programmable outputs that permit various output voltage levels, output signal types, skew control, and output frequencies. Furthermore, flexible output banking structures may be provided along with a programmable output impedance. The clock generator may also permit JTAG or other automated testing.

Embodiments described above illustrate but do not limit the invention. It should also be understood that numerous modifications and variations are possible in accordance with the principles of the present invention. Accordingly, the scope of the invention is defined only by the following claims.

We claim:

1. A clock generator comprising:

an input circuit adapted to selectively receive an input signal and modify a frequency of the input signal by a first programmable amount to generate a first input signal;

a feedback loop circuit adapted to receive a feedback signal and modify a frequency of the feedback signal by a second programmable amount to generate a second input signal;

a phase-locked loop core adapted to receive the first input signal and the second input signal and provide a first signal;

a divider circuit adapted to receive the first signal and modify a frequency of the first signal to generate a plurality of second signals having programmable frequencies;

an output circuit adapted to select from the plurality of second signals and provide at least one output signal; and a skew control circuit adapted to selectively apply skew to the output signal by a third programmable amount, wherein the first, second, and third programmable amounts and the programmable frequencies are determined by data selected from electrically erasable memory.

2. The clock generator of claim 1, wherein the feedback signal is selected from an internal feedback signal and an external feedback signal, the skew control circuit further adapted to selectively apply skew to the internal feedback signal by a fourth programmable amount.

3. The clock generator of claim 1, wherein the skew control circuit may be selectively bypassed.

4. The clock generator of claim 1, wherein the skew comprises coarse adjustments or fine adjustments.

5. The clock generator of claim 1, wherein the output signal comprises two, single-ended signals or a differential signal, and the skew applied to each of the single-ended signals by the skew control circuit may differ.

6. The clock generator of claim 1, wherein a control signal determines the data selected from the electrically erasable memory.

7. The clock generator of claim 1, further comprising input/output boundary scan circuits adapted to provide JTAG test support for the clock generator.

8. The clock generator of claim 7, wherein the JTAG test support provides IEEE 1149.1 compliance.

9. The clock generator of claim 1, wherein the clock generator is in-system programmable.

10. The clock generator of claim 9, wherein the clock generator is in-system programmable by supporting IEEE 1532 standards.

11. The clock generator of claim 1, wherein the output circuit is further adapted to provide the, output signal over a range of selectable voltage levels, signal types, and output impedances, and the input circuit is further adapted to receive the input signal having a possible range of voltage levels and signal types.

12. An integrated circuit comprising:
means for selecting from a plurality of input signals and generating a first input signal having a configurable frequency;
means for selecting from a plurality of feedback signals and generating a second input signal having a configurable frequency;
a phase-locked loop core adapted to receive the first input signal and the second input signal and generate a first signal;
means for receiving the first signal and generating a plurality of second signals having configurable frequencies;
means for selecting from the second signals and providing a plurality of output signals; and
means for selectively skewing each of the output signals and at least one of the feedback signals.

13. The integrated circuit of claim 12, wherein the skewing comprises coarse adjustments or fine adjustments.

14. The integrated circuit of claim 12, further comprising means for providing configurability and in-system programmability.

15. The integrated circuit of claim 12, further comprising means for testing the integrated circuit to provide IEEE 1149.1 compliance.

16. The integrated circuit of claim 12, further comprising means for selecting the configurable frequency for the first input signal and the second input signal and the configurable frequencies for the second signals.

17. The integrated circuit of claim 12, wherein the input signals have a possible range of voltage levels and signal types, and the output signals each have a programmable voltage level and signal type.

18. The integrated circuit of claim 17, wherein the signal type comprises single-ended signals and differential signals.

19. A method of generating clock signals, the method comprising:
receiving an input signal, wherein the input signal may be a single-ended signal type or a differential signal type;
modifying a frequency of the input signal by an amount determined from a first set of data selected from memory to provide a first input signal;
receiving a feedback signal;
modifying a frequency of the feedback signal by an amount determined from a second set of data selected from the memory to provide a second input signal;
aligning a frequency and/or a phase of the first input signal and the second input signal to provide a first signal;
modifying a frequency of the first signal to generate a plurality of second signals having frequencies determined from a third set of data selected from the memory;
selecting from the second signals a plurality of output signals, which have programmable voltage levels and signal types; and
applying skew to the output signals by an amount determined from a fourth set of data selected from memory.

20. The method of claim 19, wherein the amount of the skew is based on coarse steps or fine steps.

21. The method of claim 19, further comprising providing in-system programmability to modify the first, second, third, and fourth set of data stored in the memory.

22. The method of claim 19, wherein a control signal selects the first, second, third, and fourth set of data stored in the memory.

23. The method of Claim 19, further comprising providing JTAG compliant functional testing.

24. A clock generator comprising:
an input circuit adapted to receive an input signal and provide the input signal to a phase-locked loop;
a phase-locked loop (PLL) adapted to receive the input signal from the input circuit and to generate in response an output signal;
an output circuit adapted to receive the output signal from the PLL and provide the output signal as a clock signal;
a first skew control circuit coupled to the PLL and adapted to generate a set of coarse skew adjustments and a set of fine skew adjustments; and
a second skew control circuit programmable to select and apply one of the skew adjustments to the output signal.

25. The clock generator of claim 24, wherein the second skew control circuit includes:
a plurality of registers programmable to store different skew selection signals;
a first multiplexer coupled to the registers and adapted to select one of the stored skew selection signals; and
a second multiplexer coupled to the first skew control circuit and to the first multiplexer and adapted to select a skew adjustment based on the skew selection signal selected by the first multiplexer.

26. The clock generator of claim 24, further comprising input/output boundary scan circuits adapted to provide JTAG test support.

27. The clock generator of claim 24, wherein the clock generator supports IEEE 1532 in-system programmable standards.

28. A method of generating clock signals, the method comprising:

providing an input signal to a phase-locked loop (PLL);

generating with the phase-locked loop an output signal in response to the input signal;

providing the output signal as a clock signal;

generating a set of coarse skew adjustments and a set of fine skew adjustments; and selecting and applying one of the skew adjustments to the output signal.

29. The method of claim 28, further comprising providing JTAG compliant functional testing.

30. The method of claim 28, further comprising providing IEEE 1532 in-system programmability.

* * * * *

UNITED STATES PATENT AND TRADEMARK OFFICE
CERTIFICATE OF CORRECTION

PATENT NO.    : 6,885,227 B2
DATED         : April 26, 2005
INVENTOR(S)   : Agrawal et al.

It is certified that error appears in the above-identified patent and that said Letters Patent is hereby corrected as shown below:

Column 11,
Line 37, "the, output" should read -- the output --.

Signed and Sealed this

Thirtieth Day of August, 2005

JON W. DUDAS
*Director of the United States Patent and Trademark Office*